US012794208B2

United States Patent

(12) United States Patent
Gammie et al.
(10) Patent No.: US 12,794,208 B2
(45) Date of Patent: Nov. 10, 2026

(54) METHOD AND APPARATUS FOR SENSING CURRENT IN A BACK-TO-BACK CONFIGURATION

(71) Applicant: Microchip Technology Incorporated, Chandler, AZ (US)

(72) Inventors: David Gammie, Chandler, AZ (US); Ehab Tarmoom, Allen Park, MI (US); Steven Chenetz, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 73 days.

(21) Appl. No.: 18/886,518

(22) Filed: Sep. 16, 2024

(65) Prior Publication Data

US 2025/0096549 A1 Mar. 20, 2025

Related U.S. Application Data

(60) Provisional application No. 63/614,034, filed on Dec. 22, 2023, provisional application No. 63/538,370, filed on Sep. 14, 2023.

(51) Int. Cl.
*H02H 1/00* (2006.01)
*H03K 17/0812* (2006.01)
*H01C 7/13* (2006.01)

(52) U.S. Cl.
CPC ..... *H02H 1/0007* (2013.01); *H03K 17/08122* (2013.01); *H01C 7/13* (2013.01); *H03K 2217/0027* (2013.01)

(58) Field of Classification Search
CPC .......... H02H 1/0007; H02H 3/08; H02H 3/02; H03K 17/08122; H03K 2217/0027; H03K 17/082; H01C 7/13
See application file for complete search history.

(56) References Cited

U.S. PATENT DOCUMENTS

2011/0309816 A1* 12/2011 Simon .................... H02P 7/292 323/311
2019/0260372 A1* 8/2019 Kamiya ........... H03K 17/08104
(Continued)

FOREIGN PATENT DOCUMENTS

GB 2418082 A 3/2006
WO WO-2021114073 A1 * 6/2021 ............ B07C 5/344

OTHER PUBLICATIONS

International Search Report & Written Opinion issued on Dec. 2, 2024 in corresponding International Application No. PCT/US2024/046931 (19 pages).

*Primary Examiner* — Daniel C Puentes
(74) *Attorney, Agent, or Firm* — Shumaker, Loop & Kendrick, LLP; Ryan M. Corbett

(57) ABSTRACT

An apparatus for sensing current in a back-to-back MOSFET configuration is provided. The apparatus may include a first MOSFET having a gate terminal, a drain terminal, and a source terminal, a second MOSFET having a source terminal coupled to the source terminal of the first MOSFET, a gate terminal, and a drain terminal, a gate driver circuit including at least one gate drive output terminal to output a gate drive signal to the gate terminals of the first and second MOSFETs, and a return terminal coupled to the source terminals of the first and second MOSFETs, a shunt resistor coupled between the source terminals of the first and second MOSFETs, and a first MOSFET return resistor coupled between the source terminal of the first MOSFET and the return terminal of the gate driver circuit. The first MOSFET return resistor resistance may be greater than a resistance of the shunt resistor.

23 Claims, 5 Drawing Sheets

(56) References Cited

U.S. PATENT DOCUMENTS

| | | | | |
|---|---|---|---|---|
| 2019/0326899 | A1* | 10/2019 | Nakamura | H03K 17/687 |
| 2020/0366079 | A1 | 11/2020 | Telefus et al. | |
| 2021/0119528 | A1 | 4/2021 | Telefus | |

* cited by examiner

METHOD AND APPARATUS FOR SENSING CURRENT IN A BACK-TO-BACK CONFIGURATION

CROSS-REFERENCE TO RELATED APPLICATION

The present application claims priority to U.S. Provisional Patent Application No. 63/538,370, which was filed on Sep. 14, 2023, and U.S. Provisional Patent Application No. 63/614,034, which was filed on Dec. 22, 2023, both of which are incorporated herein by reference in their entirety.

TECHNICAL FIELD

The present disclosure relates generally to sensing current in a bi-directional circuit interruption device, and more specifically to sensing current in a back-to-back configuration.

SUMMARY

According to an aspect of various examples, there is provided an apparatus for sensing current in a back-to-back MOSFET configuration. The apparatus may include a first MOSFET having a gate terminal, a drain terminal, and a source terminal, a second MOSFET having a source terminal coupled to the source terminal of the first MOSFET, a gate terminal, and a drain terminal, a gate driver circuit including at least one gate drive output terminal to output a gate drive signal to the gate terminals of the first and second MOSFETs and a return terminal coupled to the source terminal of the first MOSFET and the source terminal of the second MOSFET, and a shunt resistor coupled between the source terminals of the first and second MOSFETs. The apparatus may include a first MOSFET return resistor coupled between the source terminal of the first MOSFET and the return terminal of the gate driver circuit. The resistance of the first MOSFET return resistor may be greater than the resistance of the shunt resistor.

The apparatus may include a second MOSFET return resistor coupled between the source terminal of the second MOSFET and the return terminal of the gate driver circuit. The resistance of the second MOSFET return resistor may be greater than the resistance of the shunt resistor. The resistance of the first MOSFET return resistor and the resistance of the second MOSFET return resistor may be substantially equal. The gate driver circuit may include an input terminal to receive a control signal, and the gate driver circuit may output the gate drive signal based on the control signal. The drain terminal of the first MOSFET may be to be coupled to a voltage source, and the drain terminal of the second MOSFET may be coupled to a load. The voltage source may be an AC voltage source. The apparatus may include an operational amplifier coupled to the shunt resistor to detect a voltage drop across the shunt resistor so as to detect current through the shunt resistor.

The at least one gate drive output terminal may include a first output terminal and a second output terminal. The first output terminal may be coupled to the second output terminal through respective gate driver output resistors to output the gate drive signal to the gate terminals of the first and second gate MOSFETs. The apparatus may include a first gate resistor coupled between the first gate terminal and the at least one gate drive output terminal, and a second gate resistor coupled between the second gate terminal and the at least one gate drive output terminal. A resistance of the first gate resistor may be greater than a resistance of the second gate resistor.

According to an aspect of various examples, there is provided an apparatus for sensing current in a back-to-back MOSFET configuration. The apparatus may include a first MOSFET having a gate terminal, a drain terminal, and a source terminal, a second MOSFET having a source terminal coupled to the source terminal of the first MOSFET, a gate terminal, and a drain terminal, a gate driver circuit including at least one gate drive output terminal to output a gate drive signal to the gate terminals of the first and second MOSFETs, and a return terminal coupled to the source terminals of the first and second MOSFETs, a shunt resistor coupled between the source terminals of the first and second MOSFETs, and a second MOSFET return resistor coupled between the source terminal of the second MOSFET and the return terminal of the gate driver circuit. The resistance of the second MOSFET return resistor may be greater than a resistance of the shunt resistor. The drain terminal of the first MOSFET may be coupled to a voltage source, and the drain terminal of the second MOSFET may be coupled to a load.

The gate driver circuit may include an input terminal to receive a control signal, and the gate driver circuit may output the gate drive signal based on the control signal. The apparatus may include an operational amplifier coupled to the shunt resistor to detect a voltage drop across the shunt resistor so as to detect current through the shunt resistor. The at least one gate drive output terminal may include a first output terminal and a second output terminal. The first output terminal may be coupled to the second output terminal to output the gate drive signal to the gate terminals of the first and second MOSFETs.

According to an aspect of various examples, there is provided a method of sensing current in a back-to-back MOSFET. The method may include generating, by a gate driver circuit, a gate drive signal to drive a gate terminal of a first MOSFET and a gate terminal of a second MOSFET, forming a gate drive signal return path from a source terminal of the second MOSFET through a shunt resistor coupled between the source terminal of the second MOSFET and a source terminal of the first MOSFET, to a return terminal of the gate driver circuit based on a resistance between the source terminal of the second MOSFET and the return terminal of the gate driver circuit that is greater than a resistance of the shunt resistor, and detecting a voltage drop across the shunt resistor so as to detect current through the shunt resistor. The method may include receiving a control signal, and the gate drive signal may be generated based on the control signal. The method may include providing an input voltage to a drain terminal of the first MOSFET, and providing an output current to a load coupled to a drain terminal of the second MOSFET. The input voltage may be an AC voltage, and the gate drive signal may cause the second MOSFET to turn on based on a polarity of the AC voltage.

DETAILED DESCRIPTION OF VARIOUS EXAMPLES

Figure 1A:
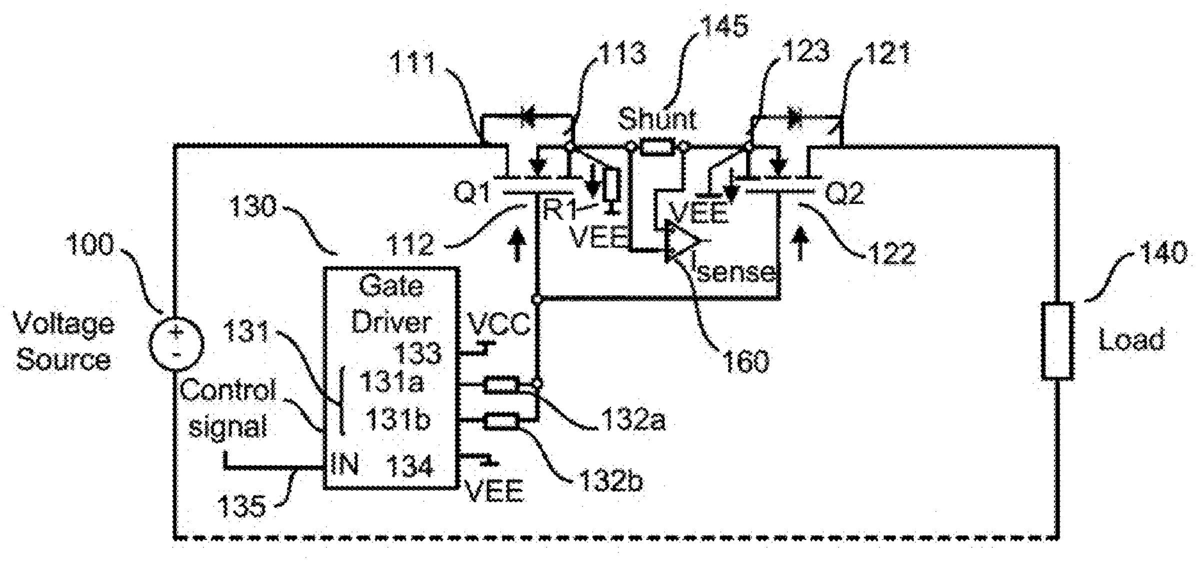
FIG. 1A shows a circuit diagram of an apparatus for sensing current in a common-source MOSFET configuration according to various examples.

Reference will now be made in detail to the following various examples, which are illustrated in the accompanying drawings, wherein like reference numerals refer to like elements throughout. The following examples may be embodied in various forms without being limited to the examples set forth herein.

Current sensing in a back-to-back MOSFET configuration is used in a variety of applications such as solid-state circuit breakers, electronic fuses, and solid-state relays. In a back-to-back MOSFET configuration a very low resistance shunt resistor may be used to sense current through the MOSFETs. However, coupling the shunt resistor, for example in a common-source configuration, where the source of a first MOSFET is coupled in series to the source of a second MOSFET, between the drain terminal of one of the MOSFETs and either the high voltage source or high voltage load results in more circuit complexity and cost, and may also need an isolation interface to isolate the MOSFETs from the high voltage source and load, which may affect accuracy, response time, and/or bandwidth. Alternatively, when the common source terminals of the MOSFETs are coupled to a return terminal of a gate driving circuit, placing the shunt resistor between the common source terminals of the MOSFETS will be ineffective because the path to the return terminal of the gate driving circuit shorts the shunt resistor, resulting in no current flowing through the shunt resistor. A shunt resistor may also be called a current sense resistor. Although the foregoing discussion references MOSFETs in a common source configuration, it may also apply to multiple MOSFETs connected in parallel, and configurations using other devices such as insulated gate bipolar transistors (IGBTs). For example, each MOSFET in a back-to-back configuration may comprise one or more MOSFETs connected in parallel to share current. In this configuration, the respective source and drain terminals of the MOSFETs are connected, and the respective gate terminals may have respective gate resistors coupled to a gate driver circuit. Therefore, a device and method for sensing current through bi-directional circuit interruption devices without increasing the cost or complexity of the circuit, or negatively impacting bandwidth or response time, is needed.

FIG. 1A shows a circuit diagram of an apparatus for sensing current in a back-to-back NMOSFET configuration according to various examples. While the figures may be particularly described in relation to an NMOSFET back-to-back configuration, this is not to be limiting in any way, and may be similarly applied to a PMOSFET or IGBT back-to-back configuration. The apparatus may include a first MOSFET Q1 having a drain terminal 111 that is coupled to a positive terminal of a DC voltage source 100, a gate terminal 112 coupled to a gate driver circuit 130, and a source terminal 113. Although the diagram of FIG. 1 shows a DC voltage source, an AC voltage source may be used according to various examples. The apparatus may also include a second MOSFET Q2 having a source terminal 123 coupled to the source terminal 113 of the first MOSFET Q1, a gate terminal 122 coupled to the gate driver circuit 130, and a drain terminal 121 coupled to a load 140. The device may include a shunt resistor 145 coupled between the source terminals 113, 123 of the first and second MOSFETs Q1, Q2. For clarity, the respective body diodes of the first MOSFET Q1 and the second MOSFET Q2 are shown.

The gate driver circuit 130 may include a gate drive output terminal 131 to output a gate drive signal to the gate terminals 112, 122 of the first and second MOSFETs Q1, Q2. The gate drive output terminal 131 may include a first or high side output terminal **131*a* and a second or low side output terminal 131*b*, which may be coupled together through two gate driver output resistors 132*a*, 132*b* respectively coupled to the first and second output terminals 131*a*, 131*b*. The first output terminal may be driven high in a first active state, and the second output terminal may be driven low in a second active state, the first and second active states not overlapping. Gate driver output resistors 132*a*, 132*b* may be respectively coupled to gate terminal 112 of first MOSFET Q1 and gate terminal 122 of second MOSFET Q2, and may respectively affect the turn-on and turn-off times of the first MOSFET Q1 and the second MOSFET Q2. For example, gate driver output resistor 132*a* may increase the turn-on time of first and second MOSFETs Q1 and Q2. Gate driver output resistor 132*b* may increase the turn-off time of first and second MOSFETs Q1 and Q2. According to various examples, one or both of the gate driver output resistors 132*a*, 132*b* may be omitted. For example, gate driver output resistor 132*a* may be included and gate driver output resistor 132*b* may be omitted so that the turn-on time is greater than the turn-off time for first and second MOSFETs Q1 and Q2. The gate driver circuit 130 may include a power supply input VCC 133 and a return terminal 134 that may be coupled to a common voltage or ground. The gate driver circuit 130 may also have an input terminal IN 135** to receive a control signal. The gate drive signal may be output based on the received control signal.

The source terminal 113 of first MOSFET Q1, and the source terminal 123 of second MOSFET Q2, may be coupled to the return terminal 134 of the gate driver circuit 130, creating return paths for the respective gate drive signals. The circuit of FIG. 1 may include a first MOSFET return resistor R1 coupled between the source terminal 113 of first MOSFET Q1 and the return terminal 134 of the gate driver circuit 130. The source terminal 123 of second MOSFET Q2 is coupled directly to the return terminal 134 of the gate driver circuit 130. The resistance of the first MOSFET return resistor R1 may be substantially greater than the resistance of the shunt resistor 145. For example, shunt resistor 145 may have a resistance of several milliohms, and the first MOSFET return resistor R1 may have a resistance of approximately 10 ohms or greater. First MOSFET return resistor R1 may have a resistance at least 10 times the resistance of shunt resistor 145, and in some examples at least 100 times the resistance of shunt resistor 145. These resistance values are merely examples, and other resistance values may be used. Because the resistance of the first MOSFET return resistor R1 is substantially greater than the resistance of the shunt resistor 145, a return path for the gate drive signal for first MOSFET Q1 is created from the gate drive output terminal 131 to the first gate terminal 112, to the first source terminal 113, through the shunt resistor 145, and back to the return terminal 134 of the gate driver circuit. The greater resistance of the first MOSFET return resistor R1, as compared to the resistance of the shunt resistor 145, causes output current for the load 140 to flow through the shunt resistor 145, which allows the output current for the load 140 to be detected as a voltage drop across the shunt resistor 145. For example, a differential op-amp 160 may be coupled to both sides of the shunt resistor 145, so as to amplify a voltage drop across the shunt resistor 145, and output a signal $I_{sense}$ corresponding to the current through the shunt resistor 145. Both output current for the load 140 and the return current for the gate drive signal for first MOSFET Q1 flow through the shunt resistor 145, however the return current for the gate drive signal for first MOSFET Q1 is extremely small in relation to the current for the load 140, and thus can be neglected in any measurement of the signal $I_{sense}$ corresponding to the current through the shunt resistor 145.

Figure 1B:
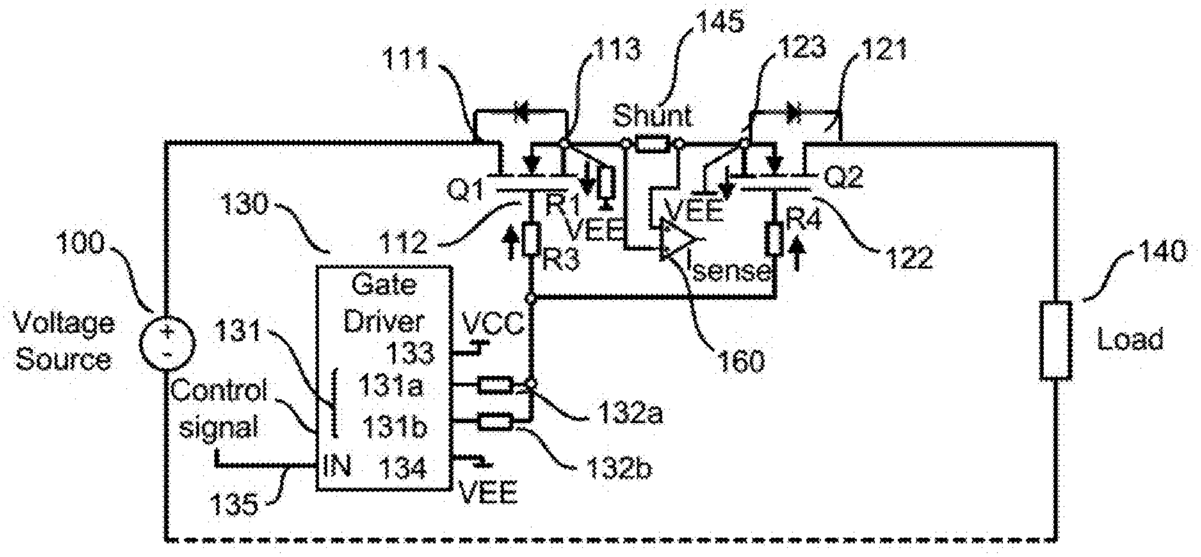
FIG. 1B shows a circuit diagram of an apparatus for sensing current in a common-source MOSFET configuration according to various examples.

FIG. 1B shows a circuit diagram of an apparatus for sensing current in a common-source MOSFET configuration according to various examples. The apparatus of FIG. 1B is similar to the apparatus of FIG. 1A, but also includes a first gate resistor R3 coupled between the gate terminal 112 of first MOSFET Q1 and the gate drive output terminal 131, and a second gate resistor R4 coupled between the gate terminal 122 of second MOSFET Q2 and the gate drive output terminal 131. The first and second gate resistors R3, R4 may be coupled to the gate drive output terminal 131 to receive the respective gate drive signal. According to one or more example embodiments, the first gate resistor R3 may have a higher resistance than the second gate resistor R4, which may cause the second MOSFET Q2 to turn on before the first MOSFET Q1.

Figure 2:
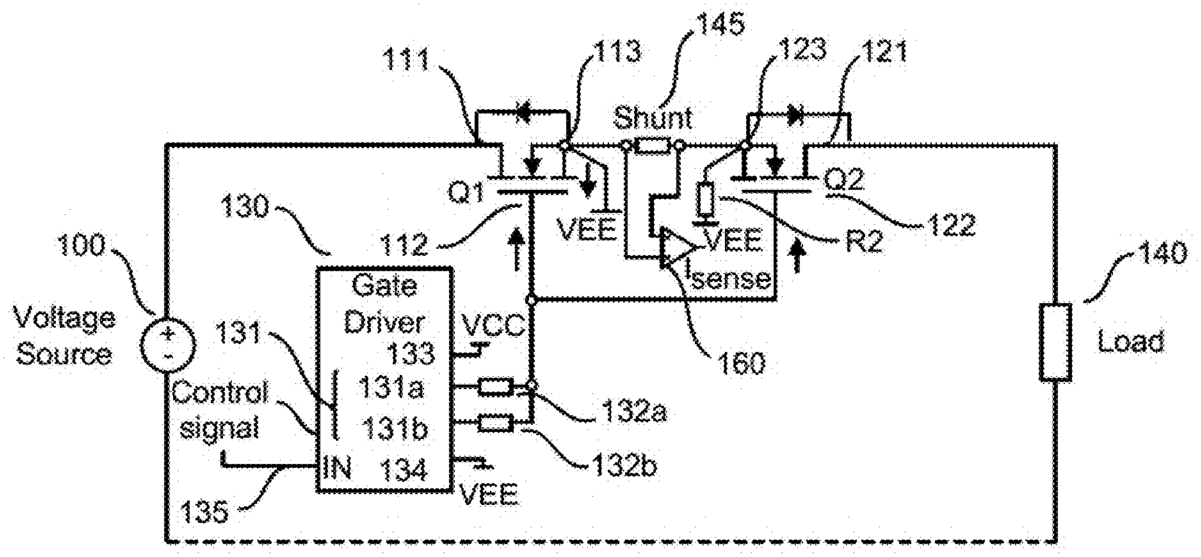
FIG. 2 shows a circuit diagram of an apparatus for sensing current in a common-source MOSFET configuration according to various examples.

FIG. 2 shows a circuit diagram of an apparatus for sensing current in a common-source MOSFET configuration according to various examples. The device shown in FIG. 2 is similar to the device shown in FIG. 1A, and some common components will not be described in detail again here to avoid redundancy. The circuit of FIG. 2 includes a second MOSFET return resistor R2 that is coupled between the source terminal 123 of second MOSFET Q2 and the return terminal 134 of the gate driver circuit 130. The first MOSFET return resistor R1 from the circuit of FIG. 1A is omitted in FIG. 2, such that the source terminal 113 of MOSFET Q1 is coupled directly to the return terminal 134 of the gate driver circuit 130. The resistance of the second MOSFET return resistor R2 may be substantially greater than the resistance of the shunt resistor 145. For example, shunt resistor 145 may have a resistance of several milli-ohms, and the second MOSFET return resistor R2 may have a resistance of approximately 10 ohms, or greater. In this example, second MOSFET return resistor R2 may have a resistance at least 10 times the resistance of shunt resistor 145, and in some examples at least 100 times the resistance of shunt resistor 145. These resistance values are merely examples, and other resistance values may be used. Because the resistance of the second MOSFET return resistor R2 is substantially greater than the resistance of the shunt resistor 145, a return path for the gate drive signal for second MOSFET Q2 is created from the gate drive output terminal 131 to the gate terminal 122 of the second MOSFET Q2, to the source terminal 123 of the second MOSFET Q2, through the shunt resistor 145, and back to the return terminal 134 of the gate driver circuit 130. The greater resistance of the second MOSFET return resistor R2, as compared to the resistance of the shunt resistor 145, causes output current for the load 140 to flow through the shunt resistor 145, which allows the output current for the load 140 to be detected as a voltage drop across the shunt resistor 145. For example, a differential op-amp 160 may be coupled to both sides of the shunt resistor 145, so as to amplify a voltage drop across the shunt resistor 145, and output a signal $I_{sense}$ corresponding to the current through the shunt resistor 145. Both output current for the load 140 and the return current for the gate drive signal for second MOSFET Q2 flow through the shunt resistor 145, however the return current for the gate drive signal for second MOSFET Q2 is extremely small in relation to the current for the load 140, and thus can be neglected in any measurement of the signal $I_{sense}$ corresponding to the current through the shunt resistor 145.

Figure 3:
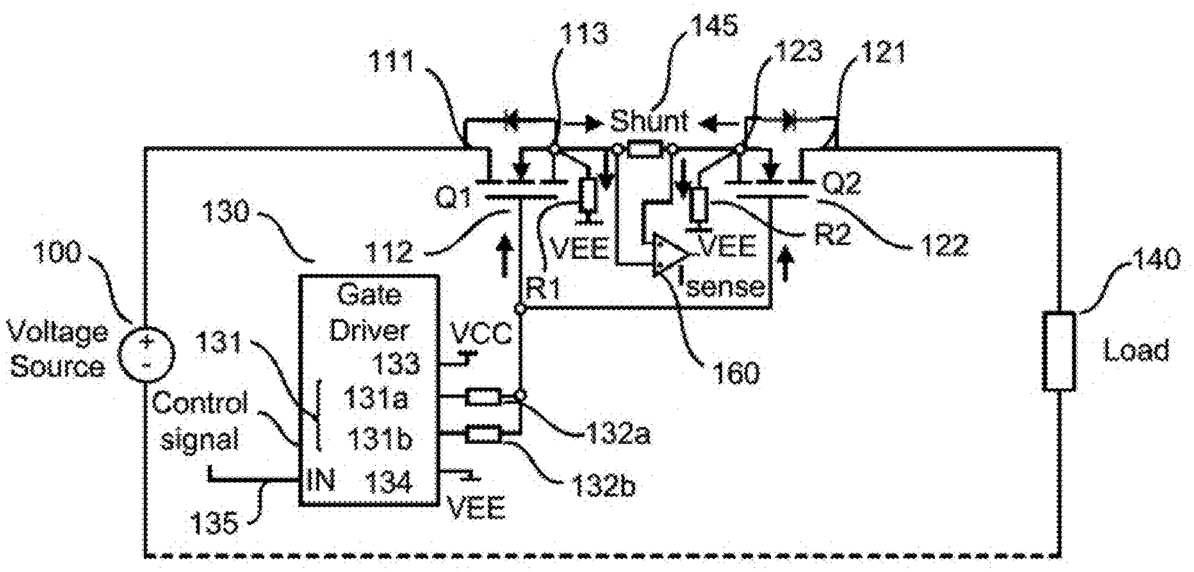
FIG. 3 shows a circuit diagram of an apparatus for sensing current in a common-source MOSFET configuration according to various examples.

FIG. 3 shows a circuit diagram of an apparatus for sensing current in a common-source MOSFET configuration according to various examples. The apparatus shown in FIG. 3 is similar to the apparatuses shown in FIGS. 1A, 1B, and 2, such that some common components will not be described in detail again here to avoid redundancy. The device shown in FIG. 3 may include a both a first MOSFET return resistor R1 coupled between the source terminal of first MOSFET Q1 and the return terminal 134 of the gate driver circuit 130, and a second MOSFET return resistor R2 coupled between the source terminal 123 of second MOSFET Q2 and the return terminal 134 of the gate driver circuit 130. According to various examples, the resistance of first MOSFET return resistor R1 may be greater than, substantially equal to, or less than the resistance of second MOSFET return resistor R2. The resistances of first MOSFET return resistor R1 and second MOSFET return resistor R2 may be substantially greater than the resistance of the shunt resistor 145. For example, shunt resistor 145 may have a resistance of several milli-ohms, and the first and second MOSFET return resistors R1, R2 may have resistances of approximately 10 ohms. In this example, first MOSFET return resistor R1 and second MOSFET return resistor R2, respectivley may have a resistance at least 10 times the resistance of shunt resistor 145, and in some examples at least 100 times the resistance of shunt resistor 145. These resistance values are merely examples, and other resistance values may be used. Because the resistance of the first MOSFET return resistor R1 and the second MOSFET return resistor R2 are substantially greater than the resistance of the shunt resistor 145, return paths for the gate drive signal are created (1) from the gate drive output terminal 131 to the gate terminal 112 of the first MOSFET Q1, to the source terminal 113 of the first MOSFET Q1, through the first MOSFET return resistor R1, and back to the return terminal 134 of the gate driver circuit 130, and (2) from the gate drive output terminal 131 to the gate terminal 122 of the second MOSFET Q2, to the source terminal 123 of the second MOSFET Q2, through the second MOSFET return resistor R2, and back to the return terminal 134 of the gate driver circuit 130. By placing first and second MOSFET return resistors R1 and R2 in the source return path, output current for the load 140 flows through the shunt resistor 145, which allows the output current for the load 140 to be detected as a voltage drop across the shunt resistor 145. The first and second MOSFET return resistors R1 and R2 may also limit the gate drive return path current to control switching behavior.

Figure 4:
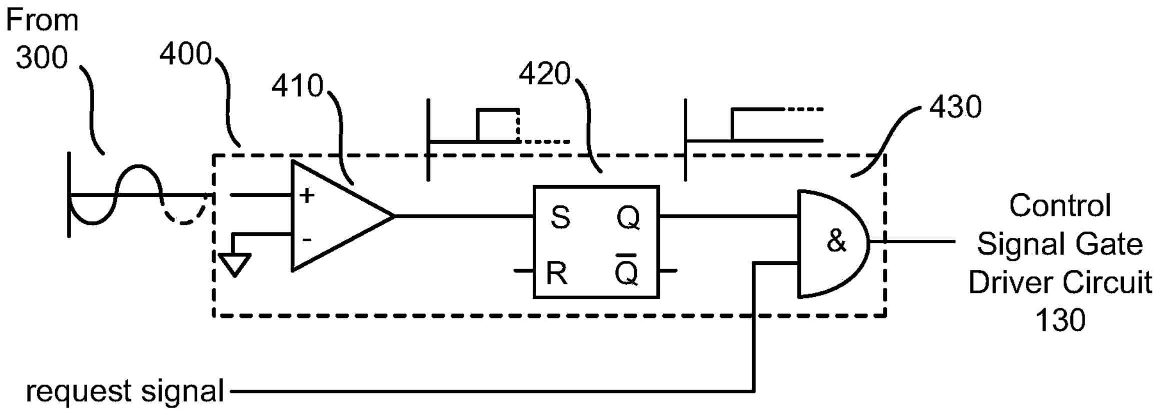
FIG. 4 shows a circuit diagram of a circuit for providing the control signal that is received by the gate driver circuit in FIG. 3 based on an AC power source according to various examples.

FIG. 4 shows a circuit diagram of a circuit for providing the control signal that is received by the gate driver circuit in FIG. 3 based on an AC power source according to various examples. The circuit 400 for providing the control signal to the gate driver circuit 130 may include a comparator 410 to receive at its first input terminal, which may be a non-inverting input terminal, an AC signal from AC power source 300. The second input terminal, which may be an inverting input terminal, of the comparator 410 may be coupled to ground. The comparator 410 may generate an output signal based on a comparison between the AC signal received from the AC power source 300 at the non-inverting input terminal, and ground. More specifically, when the AC signal is negative, the comparator 410 generates a first logic output, e.g., a logic low output, and when the AC signal is positive, the comparator 410 generates a second logic output, e.g., a logic high output. The output of the comparator 410 is output to an S-input of an S-R latch 420. The S-R latch 420 passes the output of the comparator 410 from the S-input to a Q-output of the S-R latch 420. For example, when the output of the comparator 410 changes from a logic low level to a logic high level, the S-R latch 420 outputs a logic high signal at the Q-output. As shown in FIG. 4, the Reset input of the S-R latch is used to reset the Q-output of the S-R latch 420 to a logic low level. The S-R latch 420 also includes an inverted Q-output, which outputs the inverted signal of the Q-output. In the example shown in FIG. 4, the inverted Q-output is not used. According to various examples, prior to switching the request signal (discussed below) from a logic low state to a logic high state, a reset signal (e.g., an active-high pulse) may be supplied to the Reset input by a controller (not shown) so that the Q-output of the S-R latch 420 becomes logic low. The Q-output of the S-R latch 420 will switch to a logic high state when the AC signal has a positive polarity following the end of the reset signal supplied to the Reset input, as explained further below.

The Q-output of the S-R latch 420 is coupled to a first input terminal of an AND gate 430. The AND gate 430 includes a second input terminal that receives the request signal, and generates a logic high output when the output of the Q-output of the S-R latch 420 and the request signal are logic high. The request signal may be provided by several sources depending on implementation. For example, the request signal may be provided by a controller that commands the gate driver circuit 130 to turn on the first and second MOSFETs Q1, Q2. The controller may be implement in, without limitation, a microcontroller unit, field programmable gate array, or discrete hardware circuit. The controller may also control the state of the Reset-input of the S-R latch 420. In examples that use a DC voltage source, such as in FIGS. 1A, 1B, and 2, the request signal may be the control signal provided to the input terminal 135 of the gate driver circuit.

In the example of FIG. 4, the output of the AND gate 430 is the control signal that is input to the input terminal 135 of the gate driver circuit 130 in FIG. 3. As described above, the gate driver circuit 130 outputs the gate drive signal to turn on the first and second MOSFETS Q1 and Q2 based on the control signal. The circuit 400 of FIG. 4 generates the control signal based on the polarity of the AC power source, which means that the gate driver circuit 130 outputs a gate drive signal to turn on the first and second MOSFETS Q1 and Q2 based on the polarity of the signal output from the AC power source 300, e.g., the control signal is asserted, i.e. high, when both the request signal is active high and the polarity of polarity of the AC power source is positive, and the control signal is deasserted, i.e. low, when the request signal is deasserted, i.e. low, or the polarity of polarity of the AC power source is not positive (e.g., negative). In one example, as a startup condition, it is important that second MOSFET Q2 be turned on first followed by first MOSFET Q1, and this is to occur when polarity is positive, so as to avoid large current flow through any of the body diodes of MOSFET Q1 or Q2. Thus, a controller may clear the S-R latch 420 immediately before asserting the request signal to ensure that the control signal to gate driver circuit 130 is asserted when the signal from the AC power source 300 next turns positive. Upon overload, detected by the controller responsive to signal $I_{sense}$ output by differential op-amp 160, the controller may deassert the request signal thereby disabling (opening) MOSFETs Q1 and Q2.

Various examples have been disclosed herein, in connection with the above description and the drawings. It will be understood that it would be unduly repetitious to literally describe and illustrate every combination and subcombination of these examples. Accordingly, all examples can be combined in any way and/or combination, and the present specification, including the drawings, shall be construed to constitute a complete written description of all combinations and subcombinations of the examples described herein, and of the manner and process of making and using them, and shall support claims to any such combination or subcombination.

It will be appreciated by persons skilled in the art that the examples described herein are not limited to what has been particularly shown and described herein above. In addition, unless mention was made above to the contrary, it should be noted that all of the accompanying drawings are not to scale. A variety of modifications and variations are possible in light of the above teachings.

What is claimed is:

1. An apparatus for sensing current in a back-to-back MOSFET configuration, the apparatus comprising:

a first MOSFET having a gate terminal, a drain terminal, and a source terminal;

a second MOSFET having a source terminal coupled to the source terminal of the first MOSFET, a gate terminal, and a drain terminal;

a gate driver circuit including at least one gate drive output terminal to output a gate drive signal to the gate terminals of the first and second MOSFETs, and a return terminal coupled to the source terminals of the first and second MOSFETs;

a shunt resistor coupled between the source terminals of the first and second MOSFETs; and a first MOSFET return resistor coupled between the source terminal of the first MOSFET and the return terminal of the gate driver circuit;

wherein a resistance of the first MOSFET return resistor is greater than a resistance of the shunt resistor.

2. The apparatus of claim 1, comprising:

a second MOSFET return resistor coupled between the source terminal of the second MOSFET and the return terminal of the gate driver circuit;

wherein a resistance of the second MOSFET return resistor is greater than the resistance of the shunt resistor.

3. The apparatus of claim 2, wherein the resistance of the first MOSFET return resistor and the resistance of the second MOSFET return resistor are substantially equal.

4. The apparatus of claim 1, wherein the gate driver circuit includes an input terminal to receive a control signal; and wherein the gate driver circuit is to output the gate drive signal based on the control signal.

5. The apparatus of claim 1, wherein the drain terminal of the first MOSFET is to be coupled to a voltage source, and the drain terminal of the second MOSFET is to be coupled to a load.

6. The apparatus of claim 5, wherein the voltage source is an AC voltage source.

7. The apparatus of claim 1, comprising an operational amplifier coupled to the shunt resistor to detect a voltage drop across the shunt resistor so as to detect current through the shunt resistor.

8. The apparatus of claim 1, wherein the at least one gate drive output terminal includes a first output terminal and a second output terminal; and wherein the first output terminal is coupled to the second output terminal through respective gate driver output resistors to output the gate drive signal to the first and second gate terminals.

9. The apparatus of claim 1, comprising:

a first gate resistor coupled between the gate terminal of the first MOSFET and the at least one gate drive output terminal; and a second gate resistor coupled between the gate terminal of the second MOSFET and the at least one gate drive output terminal.

10. The apparatus of claim 9, wherein a resistance of the first gate resistor is greater than a resistance of the second gate resistor.

11. The apparatus of claim 1, wherein the resistance of the first MOSFET return resistor is greater than the resistance of the shunt resistor as to create a return path for the gate drive signal such that output current for a load is caused to flow through the shunt resistor, thereby allowing the output current for the load to be detected as a voltage drop across the shunt resistor.

12. An apparatus for sensing current in a back-to-back MOSFET configuration, the apparatus comprising:

a first MOSFET having a gate terminal, a drain terminal, and a source terminal;

a second MOSFET having a source terminal coupled to the source terminal of the first MOSFET, a gate terminal, and a drain terminal;

a gate driver circuit including at least one gate drive output terminal to output a gate drive signal to the gate terminals of the first and second MOSFETs, and a return terminal coupled to the source terminals of the first and second MOSFETs;

a shunt resistor coupled between the source terminals of the first and second MOSFETs; and a second MOSFET return resistor coupled between the source terminal of the second MOSFET and the return terminal of the gate driver circuit;

wherein a resistance of the second MOSFET return resistor is greater than a resistance of the shunt resistor and wherein the drain terminal of the first MOSFET is to be coupled to a voltage source, and the drain terminal of the second MOSFET is to be coupled to a load.

13. The apparatus of claim 12, wherein the gate driver circuit includes an input terminal to receive a control signal; and wherein the gate driver circuit is to output the gate drive signal based on the control signal.

14. The apparatus of claim 12, comprising an operational amplifier coupled to the shunt resistor to detect a voltage drop across the shunt resistor so as to detect current through the shunt resistor.

15. The apparatus of claim 12, wherein the at least one gate drive output terminal includes a first output terminal and a second output terminal; and wherein the first output terminal is coupled to the second output terminal to output the gate drive signal to the gate terminals of the first and second MOSFETs.

16. The apparatus of claim 12, wherein the resistance of the second MOSFET return resistor is greater than the resistance of the shunt resistor, as to create a return path for the gate drive signal for the second MOSFET such that output current for the load is caused to flow through the shunt resistor, thereby allowing the output current to be detected as a voltage drop across the shunt resistor.

17. A method of sensing current in a back-to-back MOSFET configuration, the method comprising:

generating, by a gate driver circuit, a gate drive signal to drive a gate terminal of a first MOSFET and a gate terminal of a second MOSFET;

forming a gate drive signal return path from a source terminal of the second MOSFET through a shunt resistor coupled between the source terminal of the second MOSFET to a return terminal of the gate driver circuit based on a resistance between the source terminal of the second MOSFET and the return terminal of the gate driver circuit that is greater than a resistance of the shunt resistor; and detecting a voltage drop across the shunt resistor so as to detect current through the shunt resistor.

18. The method of claim 17, comprising receiving a control signal;

wherein the gate drive signal is generated based on the control signal.

19. The method of claim 17, comprising:

providing an input voltage to a drain terminal of the first MOSFET; and providing an output current to a load coupled to a drain terminal of the second MOSFET.

20. The method of claim 19, wherein the input voltage is an AC voltage, and wherein the gate drive signal causes the second MOSFET to turn on based on a polarity of the AC voltage.

21. The method of claim 17, wherein the detecting a voltage drop across the shunt resistor includes using an operational amplifier coupled to the shunt resistor to sense a voltage drop across the shunt resistor.

22. The method of claim 17 comprising turning on the second MOSFET before turning on the first MOSFET.

23. The method of claim 17, wherein the gate drive signal return path is formed such that output current for a load is caused to flow through the shunt resistor.

* * * * *